(12) United States Patent
Alley (10) Patent No.: US 8,688,862 B1
(45) Date of Patent: Apr. 1, 2014

(54) SYSTEMS AND METHODS FOR MONITORING INPUT SIGNAL PARAMETERS

(71) Applicant: General Electric Company, Schenectady, NY (US)

(72) Inventor: Daniel Milton Alley, Salem, VA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/671,229

(22) Filed: Nov. 7, 2012

(51) Int. Cl.
*G06F 13/00* (2006.01)

(52) U.S. Cl.
USPC .................................................. 710/1; 710/72

(58) Field of Classification Search
None
See application file for complete search history.

(56) References Cited

U.S. PATENT DOCUMENTS

| 3,922,537 | A |   | 11/1975 | Jackson |   |
|---|---|---|---|---|---|
| 4,057,785 | A |   | 11/1977 | Furniss et al. |   |
| 4,417,248 | A | * | 11/1983 | Mathews | 342/29 |
| 4,545,029 | A |   | 10/1985 | Collier |   |
| 5,010,560 | A |   | 4/1991 | Janney et al. |   |
| 5,416,397 | A | * | 5/1995 | Mazzara et al. | 318/696 |
| 5,426,774 | A |   | 6/1995 | Banerjee et al. |   |
| 5,491,792 | A |   | 2/1996 | Grisham et al. |   |
| 6,135,777 | A |   | 10/2000 | Vogel |   |
| 6,196,773 | B1 | * | 3/2001 | Hyatt et al. | 408/1 R |
| 6,970,095 | B1 | * | 11/2005 | Lee et al. | 340/669 |
| 7,460,058 | B2 | * | 12/2008 | Nakanishi | 342/128 |
| 7,528,375 | B2 | * | 5/2009 | Matsumoto | 250/370.01 |
| 8,384,570 | B2 | * | 2/2013 | Hunter | 341/112 |
| 2012/0143834 | A1 | * | 6/2012 | Ebiyama et al. | 707/693 |

\* cited by examiner

*Primary Examiner* — Cheng-Yuan Tseng
(74) *Attorney, Agent, or Firm* — Sutherland Asbill & Brennan LLP (57) ABSTRACT

Systems and methods for monitoring input signal parameters are provided. One embodiment may include an input unit for receiving at least three signals. The at least three signals can comprise at least one value associated with at least one monitored parameter. The system may further include at least one controller for determining that the at least one value of the at least three signals is outside of a predetermined range of values, detecting a deviation in the at least one value associated with the at least three signals from an expected value within the predetermined range of values, determining that the deviation exceeds a predetermined period of time threshold, and determining a change in at least one of the at least three signals based at least in part on the determination that the deviation exceeds the threshold period of time.

20 Claims, 7 Drawing Sheets

SYSTEMS AND METHODS FOR MONITORING INPUT SIGNAL PARAMETERS

TECHNICAL FIELD

Embodiments of the disclosure relate generally to processing of electrical signals, and more specifically to systems and methods for monitoring input signal parameters such as timing or phase relationships.

BACKGROUND

Devices that provide electrical signal outputs and/or are controlled by electrical signal inputs are referred to generally as input/output (I/O) devices. The I/O devices convert electrical signals into raw digital or analog values and convert digital or analog values into electrical control signals, which are usually interpreted by remotely hosted software into meaningful outputs. Some I/O devices use multiple signals to communicate the information, such as A-quad-B encoders that represent incremental changes both in the amount and direction of shaft rotations. Typically, the remotely hosted software is programmed with specific knowledge of the I/O device to enable monitoring and control of the I/O device, which may include tens of thousands of I/O points along with forms of redundancy to support various different I/O functions as desired.

BRIEF DESCRIPTION OF THE DISCLOSURE

Embodiments of the disclosure may include systems and methods for monitoring input signal parameters and their timing and phase relationships. In particular, certain embodiments can include systems and methods for providing a configurable pin interface for monitoring one or more signal parameters. According to one embodiment of the disclosure, there is provided a method. The method may include receiving, by at least one controller, at least three signals. The at least three signals can comprise at least one value associated with at least one monitored parameter. The method may further include determining that the at least one value for the at least three signals is outside of a predetermined range of values. The method may further include detecting a deviation of the at least one value associated with the at least three signals from an expected value within the predetermined range of values. The method may further include determining that a duration of the deviation exceeds a predetermined time threshold. The method may further include determining a change in at least one of the at least three signals based at least in part on determining that the duration of the deviation exceeds the predetermined time threshold.

In another embodiment of the disclosure, a system is provided. The system may include an interface unit configured to receive at least three signals. The at least three signals may comprise at least one value associated with at least one monitored parameter. The system may further include at least one controller. The at least one controller may be configured to determine that the at least one value of the at least three signals is outside of a predetermined range of values. The at least one controller may be further configured to detect a deviation of the at least one value associated with the at least three signals from an expected value within the predetermined range of values. The at least one controller may be further configured to determine that a duration of the deviation exceeds a predetermined time threshold. The at least one controller may be further configured to determine a change in at least one of the at least three signals based at least in part on determining that the duration of the deviation exceeds the time threshold. The at least one controller can be further configured to generate a log entry associated with the change in at least one of the at least three signals. The at least one controller may be further configured to generate time stamps associated with the change in the at least one of the at least three signals.

Additional systems, methods, apparatus, features, and aspects are realized through the techniques of various embodiments of the disclosure. Other embodiments and aspects of the disclosure are described in detail herein and are considered a part of the claimed disclosure. Other embodiments and aspects can be understood with reference to the description and the drawings.

BRIEF DESCRIPTION OF THE DRAWINGS

Having thus described the disclosure in general terms, reference will now be made to the accompanying drawings, which are not necessarily drawn to scale, and wherein:

DETAILED DESCRIPTION

Illustrative embodiments of the disclosure now will be described more fully hereinafter with reference to the accompanying drawings, in which some, but not all embodiments of the disclosure are shown. Indeed, the disclosure may be embodied in many different forms and should not be construed as limited to the embodiments set forth herein; rather, these embodiments are provided so that this disclosure will satisfy applicable legal requirements. Like numbers refer to like elements throughout.

According to one aspect of the disclosure, one or more devices or systems comprising an application-specific integrated circuit (ASIC) may be provided for use with a programmable circuitry to support various different functions, for instance, measuring input signal parameters, such as found in industrial controls, including voltage measurements, timing measurements, frequency measurements, phase measurements, and so forth. According to other aspects of the present disclosure, there may be provided an interface between the ASIC and programmable logic, such as a Complex Programmable Logic Device (CPLD) or Field-Programmable Gate Array (FPGA). This interface may be split up so that the ASIC provides analog processing including threshold comparators and filters while the programmable logic comprises the state machines and counters for determining signal states and time stamping. In certain embodiments of the disclosure, the ASIC interface may support monitoring the sequence of events (SOE), incremental encoders using quadrature encoding with reference pulses, frequency modulated (FM) pulse, and pulse width modulation (PWM).

In certain embodiments, the ASIC interface may be configured to support a universal input/output (I/O) channel for one or more of analog and digital signal communications occurring between the ASIC and an I/O device. For instance, the ASIC interface may include a configurable pin interface for multiple digital channel types for communications between the signal sources and a monitoring system such as a computer. In some embodiments, the ASIC interface may include registers for storing digital data such as configuration commands, signal control commands, and digital signal information. Additionally, to support analog communications, the ASIC interface may include an analog signal processing section in digital data communication with the registers of a digital signal processing section. The analog signal processing section may include multiple function-specific elements for processing an electrical signal that may be communicated via a pin interface. Accordingly, the analog signal processing section may be configured to establish one of multiple different function-specific processing paths in response to one or more configuration commands.

In one example embodiment of the disclosure, the ASIC interface may be used for pre-processing digital or analog signals obtained from one or more signal sources and sending pre-processed signals to a monitoring system. This approach may be useful with a plurality of signal sources when the number of various signals is too large to be processed using standard computational resources. In other words, in conventional monitoring systems it can difficult to monitor a large number (e.g., more than about 20) of frequently varying signals because this task will require using multiple input/output interfaces, fast bus communications, and high computational resources.

The technical effects of certain embodiments of the disclosure may include simplifying the process of monitoring multiple electrical signals over an extended period of time without the need for enhanced computational resources. Further technical effects may include reduction in costs of receiving multiple electrical signals compared to conventional monitoring systems using extended input/output interfaces. Yet further technical effects may include facilitating or improving the fault determining process by providing timely information to a monitoring system about particular signal deviations and time stamps associated with the initial stages of the deviation and the duration of the deviation.

Figure 1:
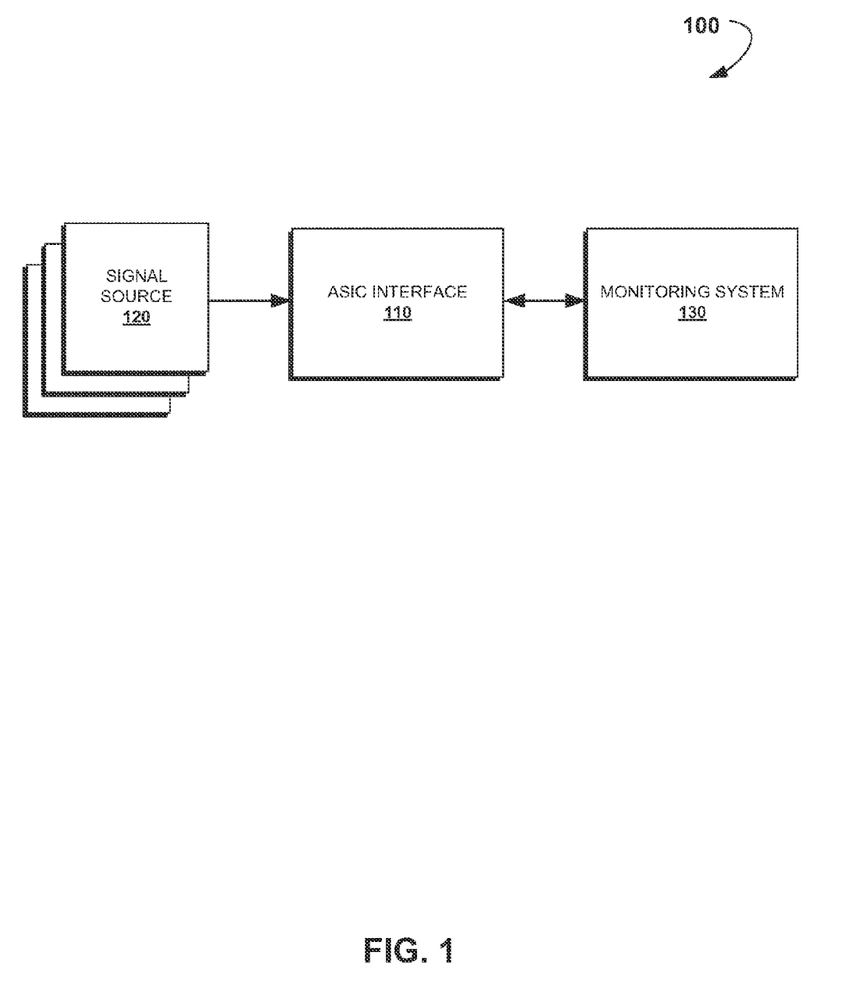
FIG. 1 shows an example system environment suitable for the use of an application-specific integrated circuit (ASIC) interface in accordance with an embodiment of the disclosure.

Referring now to the drawings, FIG. 1 shows an example system environment 100 suitable for the use of an ASIC interface 110. As shown in the figure, the system environment 100 may include one or more signal sources 120 such as various sensors, detectors, voltmeters, ammeters, ohmmeters, and counters (e.g., rolling counters, quadrature counters, and A-quad-B counters). The signal sources 120 may be connected to any type of machine including an engine, a turbine, a power machine, or other device so that the signal sources 120 may generate digital or analog electrical signals associated with one or more operational parameters. Examples of the operational parameters may include frequency, speed, direction of rotation of a shaft, angle of a rotating shaft, voltage or current values, electrical resistance, capacitance, inductance, temperature, pressure, stress levels, precipitation levels, and so forth. The signal sources 120 may be coupled to the ASIC interface 110 such that the ASIC interface 110 receives analog or digital signals generated by the signal sources 120. It should be understood that there may be any number of signal sources 120 and thus the number of generated signals received by the ASIC interface 110 may be quite large.

With continuing reference to FIG. 1, the system environment 100 may include a monitoring system 130. The monitoring system 130 may be in communication with the ASIC interface 110 such that the ASIC interface 110 may transmit data (e.g., pre-processed signals received from the signal sources 120) to the monitoring system 130 for further displaying, recording, monitoring, or other processing. The monitoring system 130 may also transmit, to the ASIC interface 110, data including instructions, timing information, requests, and so forth. The instructions generated by the monitoring system 130 may be used to configure the ASIC interface 110 to operate in one or more modes (e.g., SOE signal processing mode, A-quad-B signal processing mode, FM signal processing mode, and PWM signal processing mode).

In an example embodiment of the disclosure, the monitoring system 130 may include a computer having one or more processors and a display. The monitoring system 130 may be used by operating staff to control the operations of a machine such as, for example, a power generating turbine.

Furthermore, communications between the ASIC interface 110 and the signal sources 120 and between the ASIC interface 110 and the monitoring system 130 may be facilitated by one or more communication networks including one or more of a peer-to-peer network, the Internet, a Local Area Network (LAN), and a Wide Area Network (WAN). The one or more communication networks may further include or interface with one or more of the following: RS-232 serial connection, Institute of Electrical and Electronics Engineers (IEEE)-1394 (also known as Firewire) connection, Fiber Channel connection, Infrared Data Association (IrDA) port, Small Computer Systems Interface (SCSI) connection, Universal Serial Bus (USB) connection, Inter-Integrated Circuit (I2C), Serial Peripheral Interface (SPI), and other wired or wireless, digital or analog interfaces and connections. It should be understood that the ASIC interface 110 may pre-process multiple signals received in parallel and output the pre-processed signals over a serial connection.

Figure 2:
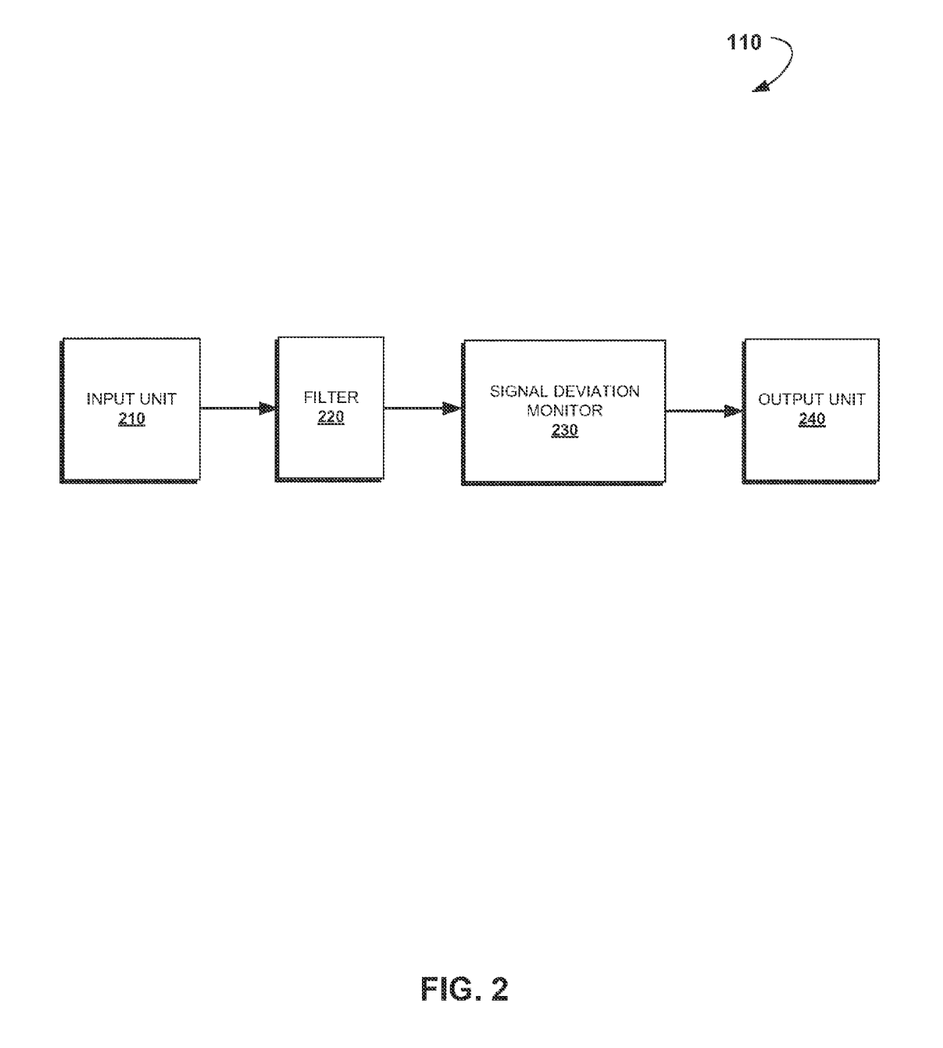
FIG. 2 shows an example ASIC interface in accordance with an embodiment of the disclosure.

FIG. 2 shows a simplified structure of the ASIC interface 110, according to an example embodiment of the disclosure. As shown in FIG. 2, the ASIC interface 110 may include an input unit 210, a filter 220, a signal deviation monitor 230, and an output unit 240. The ASIC interface 110 may include one or more of an integrated circuit, a chip, a controller, a microcontroller, a multiprocessor system, and a printed wiring board having one or more interconnected circuits. Furthermore, the ASIC interface 110 may be "modular" so that two or more ASIC interfaces 110 may be connected together to pre-process any number of input signals. In addition, the ASIC interface 110 may include one or more channels to process input signals, wherein the one or more channels may process data independently. It should be also understood that the ASIC interface 110 may include further modules or units, the description of which is omitted for simplicity of presentation.

The input unit 210 may include one or more terminals (e.g., pins) to receive one or more electrical analog or digital signals. The input unit 210 may also include one or more circuits to transform the received signals into a form suitable for further processing. These circuits may include analog-to-digital convertors, comparators, amplifiers, hysteresis state machines, switches, galvanic separation circuits, voltage dividers, fuse circuits, stabilizers, and so forth. The selection and use of these circuits may depend on the type of signals and their values. In an example, the input unit 210 may receive a repetitive analog signal and transform the analog signal into a digital pulsed signal.

The filter 220 may be configured to filter the signals which are received and, optionally, transformed by the input unit 210. The filter 220 may include one or more of a low-pass filter, a time-based low-pass filter, a high-pass filter, a time-based high-pass filter, and so forth. In an example embodiment, the filter 220 may eliminate chattering, debouncing, or other fluctuations.

The signal deviation monitor 230 may be configured to locate certain deviations in signals, generate time stamps associated with signal deviations, and generate output signals informing of the signal deviations and times of their occurrences. The signal deviation monitor 230 may include one or more counters, one or more logic elements, control elements, state machines, time stamp generators, clocks, and so forth. More specifically, the signal deviation monitor 230 may monitor one or more values associated with received input signals such as a frequency. Once the one or more values exceed a predetermined range of values, the signal deviation monitor 230 may measure a duration of a time period during which the one or more values exceed the predetermined range of values. If it is determined that the one or more values exceed the predetermined range of values for a predetermined period of time or longer, the signal deviation monitor 230 may classify the deviation of the one or more values. For a discovered deviation, the signal deviation monitor 230 may also generate a time stamp related to a time or a time period of the deviation. The time stamp may be then associated with the deviation. For example, the signal deviation monitor 230 may generate a new output signal informative of the deviation and its time. The output signal can also include additional information like values of the deviated signal over a period of time, a source of the deviated signal, and so forth.

In some example embodiments of the disclosure, the signal deviation monitor 230 may receive instructions from the monitoring system 130. The instructions may re-configure the operation of the signal deviation monitor 230 such that the signal deviation monitor 230 operates in one of the modes including a SOE signal processing mode, A-quad-B signal processing mode, FM signal processing mode, and PWM signal processing mode. The signal deviation monitor 230 may also receive timing data from the monitoring system 130. In some embodiments of the disclosure, the timing data may be used for synchronization.

The output unit 240 may include one or more terminals (e.g., pins) for outputting the output signals generated by the signal deviation monitor 230. The output unit 240 may also include one or more registers or a memory unit for storing the output signals generated by the signal deviation monitor 230. The storage of the output signals may be temporary until the registers are read.

Figure 3:
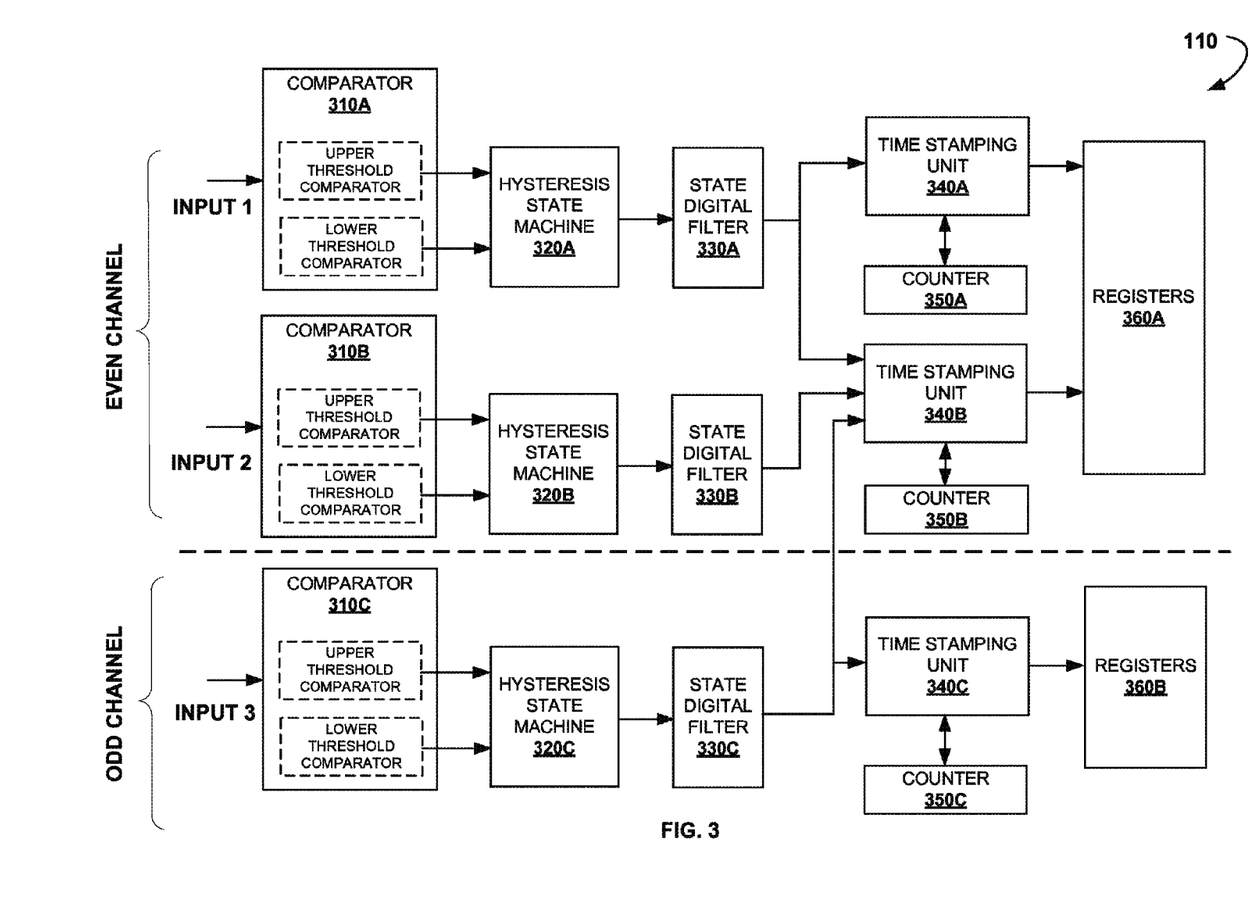
FIG. 3 shows an example ASIC interface having two input channels in accordance with an embodiment of the disclosure.

FIG. 3 shows a more detailed embodiment of the ASIC interface 110 having two input channels. As shown in FIG. 3, an "even channel" and an "odd channel" may be configured to receive at least three signals from a signal source 120 such as, for example, a rotary counter. The rotary counter may be used for determining a speed, direction and angle of rotation of a shaft pertaining to an engine, turbine or a similar apparatus. The rotary counter may generate three digital signals, whereas a first signal and a second signal may be indicative of the angular position and motion of a shaft, while a third signal may be indicative of synchronization (timing) information. In an example, the third signal may include pulses, which determine when the shaft is rotated through a "zero" or a "start" point. As shown in the figure, the first signal and the second signal may be provided to the even channel, while the third signal may be provided to the odd channel. It should be recognized that there may be a number of various channels and input signals depending on a particular application.

With continuing reference to FIG. 3, the ASIC interface 110 may include comparators 310A-310C, hysteresis state machines 320A-320C, state digital filters 330A-330C, time stamping units 340A-340C, counters 350A-350C, and registers 360A and 360B. The aforementioned elements may include logic or other circuits which can be configured by the monitoring system.

In operation, the input signals received from one or more signal sources 120 may be supplied to the comparators 310A-310C. The comparators 310A-310C may be configured to test voltage values of the input signals and allow transmittance of the input signals in a predetermined amplitude range. As shown, the comparators 310A-310C may include two sub-comparators to generate signals associated with an upper threshold and a lower threshold. These two thresholds may be used for analog signals so that the sub-comparators generate digitized binary values (e.g. "0" or "1") when the input is above the upper threshold and cleared when the input is below the lower threshold. This provides noise suppression of analog signal changes. The signals may be then fed into the hysteresis state machines 320A-320C which may control comparators, determine faults, and generate flags for faults. In other words, the hysteresis state machines 320A-320C may monitor comparator operation compliance.

The signal output from the hysteresis state machines 320A-320C may be fed to the state digital filters 330A-330C configured to perform noise filtering. Specifically, the state digital filters 330A-330C may perform low pass filtering or other debounce filtering. The filtering uses a timing threshold supplied from the monitoring system 130, where the binary signal is stable with no changes for a certain amount of time. This approach both filters out "chatter" such as seen from a switch in the process of closing due to mechanical contact bounces as well as filtering out signals when the analog parameter is oscillating (e.g., a fluid level measurement when the fluid surface is subject to sloshing). The signal output from the filters 330A-330C may be supplied to time stamping units 340A-340C.

The time stamping units 340A-340C may be configured to monitor the input signals in order to determine deviations which can indicate value changes in one or more parameters associated with the input signals. For example, the time stamping units 340A-340C may be indicative of one or more of frequency, phasing, deviations in frequency, amplitude, speed, and other parameters. For a determined deviation, the time stamping units 340A-340C may generate flags including corresponding time stamps. The time stamps may be generated based at least in part on the signal received from the counters 350A-350C. Accordingly, the flags may indicative of the time associated with the deviation and the type of the deviation. The flags may also depend on a type of the input signals and/or an operational mode of the ASIC interface 110.

In the described example embodiment, the time stamping units 340A and 340C may generate flags when the operational mode of the ASIC interface 110 includes one or more of an SOE signal processing mode, FM signal processing mode, or PWM signal processing mode. The time stamping unit 340C may generate one or more flags when the operational mode of the ASIC interface 110 is preset to an A-quad-B signal processing mode.

Furthermore, the flags indicating deviations in one or more signal parameters may be provided to the registers 360A, 360B. Although, as shown, the even and odd channels may be associated with their own registers, it should be understood that a single register unit may be utilized. The registers 360A, 360B may be configured to store the flags until they are transmitted to the monitoring system 130. In an example embodiment, the registers 360A, 360B may include First-In-First-Out (FIFO) buffers.

According to one or more embodiments of the disclosure, to reduce memory and computational resource utilization, the registers 360A, 360B may store just a few flags. For example, the registers may store the first, second, and most recent flags as used in the SOE mode. This approach may be useful when there are a big number of flags generated within a short period of time. Indeed, from the machine operation monitoring perspective, it may be helpful to identify a fault and the time of its occurrence. Based on the time of its occurrence, a cause of the fault can be determined by associating the fault with one or more contemporary events. Thus, it can be valuable to store and analyze the first flag and one or more of the following flags as indicating the sequence of events leading to the fault.

Although, in the described embodiment, at least the first, second and most recent flags are stored, other approaches may be used as well. For example, if the fault persists, the flags may be stored periodically, or, alternatively, only the first and the most recent flags may be stored. Those skilled in the art will appreciate that various flag storage approaches may be used depending on the application.

The monitoring system 130 may periodically empty the registers 360A, 360B after the flags are read. The read operation may involve receiving, from the monitoring system 130, a flag indicating that the read operation is in progress, reading the stored flags, and clearing the flag indicating that the read operation is in progress.

According to one or more embodiments of the disclosure, the number of input terminals (e.g., pins) in the ASIC interface 110 used for receiving signals from the signal sources 120 may vary depending on the application and particular operation mode. For example, in the SOE signal processing mode, the input signals may be received via input terminal 1 and/or input terminal 3. In the FM signal processing mode, the input signals may be received via input terminal 1 or input terminal 3. In the PWM signal processing mode, the input signals may be received via input terminal 1 and/or input terminal 3. In the A-quad-B signal processing mode, the input signals may be received via input terminal 1, 2 and 3. The ASIC interface 110 may change operation modes to measure one or more values upon receipt of corresponding instructions from the monitoring system 130 or other logic.

Figure 4:
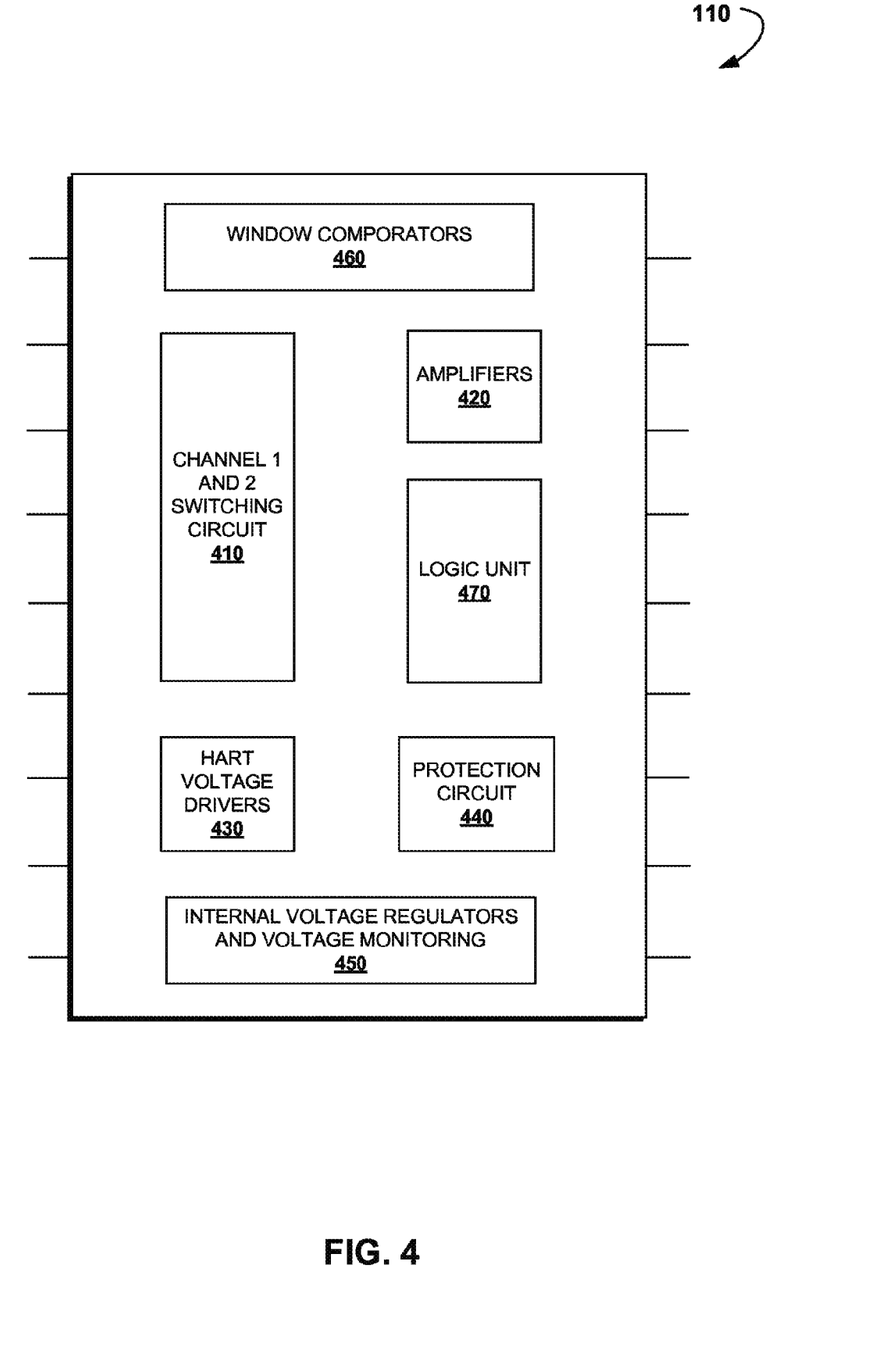
FIG. 4 shows an example ASIC interface having components embedded within an integrated circuit (IC) in accordance with an embodiment of the disclosure.

As discussed above, the ASIC interface 110 may be implemented as a single integrated circuit (IC) or a chip having multiple input and output terminals. FIG. 4 shows an example embodiment of the ASIC interface 110 having all components embedded within a single IC. In this implementation, the ASIC interface 110 may be effectively used in input/output interfaces or in systems including analog-to-digital and digital-to-analog components. The ASIC interface 110 may include one or more channels (e.g., even and odd channels) using one, two, or more input terminals per channel.

As shown in FIG. 4, the ASIC interface 110 may include a switching circuit 410 configured to transmit received signals over channel 1 and channel 2. In other words, the switching circuit 410 may connect/disconnect the ASIC interface 110 to one or more signal sources 120. The switching circuit 410 may have additional low level switches for burnout protection, high current switches for solid state contact output modes, voltage comparators for contact input modes, and multiplexing circuits or other logic elements for configuring input signals into signals suitable for further processing by other components.

The ASIC interface 110 may further include amplifiers 420 for each channel. The amplifiers 420 may adjust the sensed voltage levels to predetermined levels (e.g., from millivolts up to tens of volts). The ASIC interface 110 may further include Highway Addressable Remote Transducer (HART) voltage drivers 430 for signaling support for current loop inputs and terminal voltage signal paths to connect external filters used for current loop outputs.

The ASIC interface 110 may further include a protection circuit 440 having sensors such as temperature sensors or current sensors. The protection circuit 440 may be used for temperature monitoring, power monitoring, and fault detection.

The ASIC interface 110 may further include internal voltage regulators and voltage monitoring circuit 450 for powering the ASIC interface 110 and maintaining stable current and voltage levels for components of the ASIC interface 110.

The ASIC interface 110 may further include window comparators 460 which may sense voltage values of input signals and confirm that the voltage values are within preset range limits prior to being provided as inputs to circuits and transmitted to other circuits of the ASIC interface 110.

The ASIC interface 110 may further include a logic unit 470 such as, for example, a controller, microcontroller, processor, or a plurality of interconnected processors to perform signal monitoring and generate flags associated with deviations in input signals. The logic unit 470 may further include internal registers, filters, state machines, counters, clocks, and parallel and/or serial interfaces.

Figure 5:
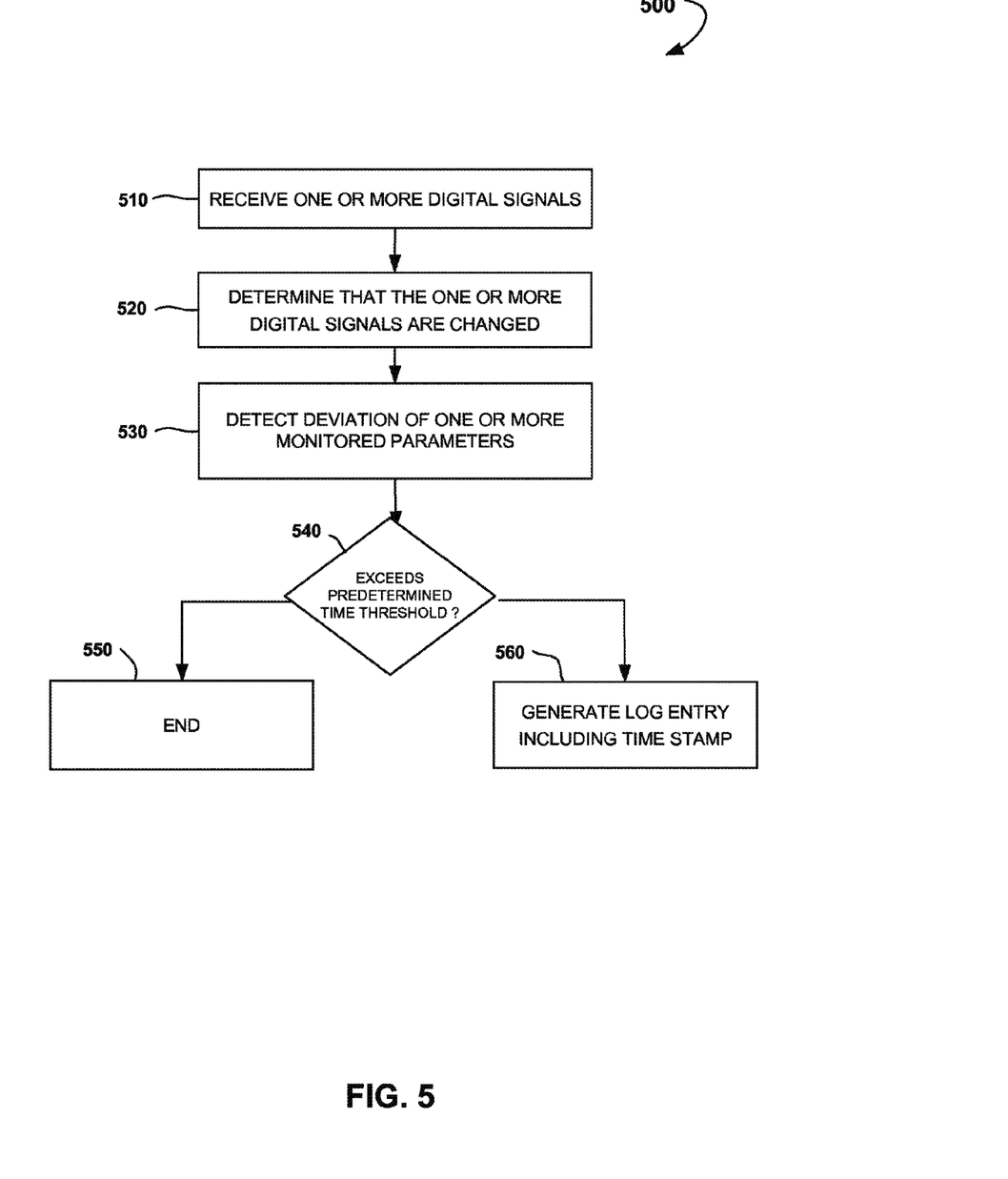
FIG. 5 shows an example flow diagram illustrating a method for monitoring one or more electrical signals according to an embodiment of the disclosure.

FIG. 5 shows a flow diagram illustrating an example method 500 for monitoring one or more electrical signals according to an embodiment of the disclosure. The method 500 may commence in operation 510, wherein one or more signals may be received via at least one channel of the ASIC interface 110. The one or more signals may refer, for example, to angular data, speed data, timing data, event data, and so forth. In an example, if the ASIC 100 interface includes two channels to process A-quad-B signals, encoder's signals A and B may be supplied to the first channel, while the third signal Z may be supplied to the second channel. The one or more received signals may be either analog or digital. Accordingly, if the signals are analog, they may be converted into binary signals by the window comparators 460.

In operation 520, the received signals may be processed to determine whether the received binary signals are changing. In operation 530, one or more monitored parameters associated with the received binary signals may be monitored to detect a deviation. In an example embodiment, the deviation may be detected when the monitored parameter is outside of the predetermined range of values during a preset time period to eliminate accidental or erroneous measurements of the monitored parameters. The predetermined range of values might be preset by the monitoring system 130.

In decision block 540, it may be determined whether the deviation exceeds a predetermined threshold, such as, for instance, a predetermined period of time to provide some form of filtering. If the deviation does not exceed the predetermined threshold, then, in operation 550, the method 500 may terminate. However, if the deviation does exceed a predetermined threshold, then, in operation 560, a log entry may be generated including information (or otherwise describing) the deviation associated with the digital signals and also a time stamp indicating a time when the deviation occurred.

Figure 6:
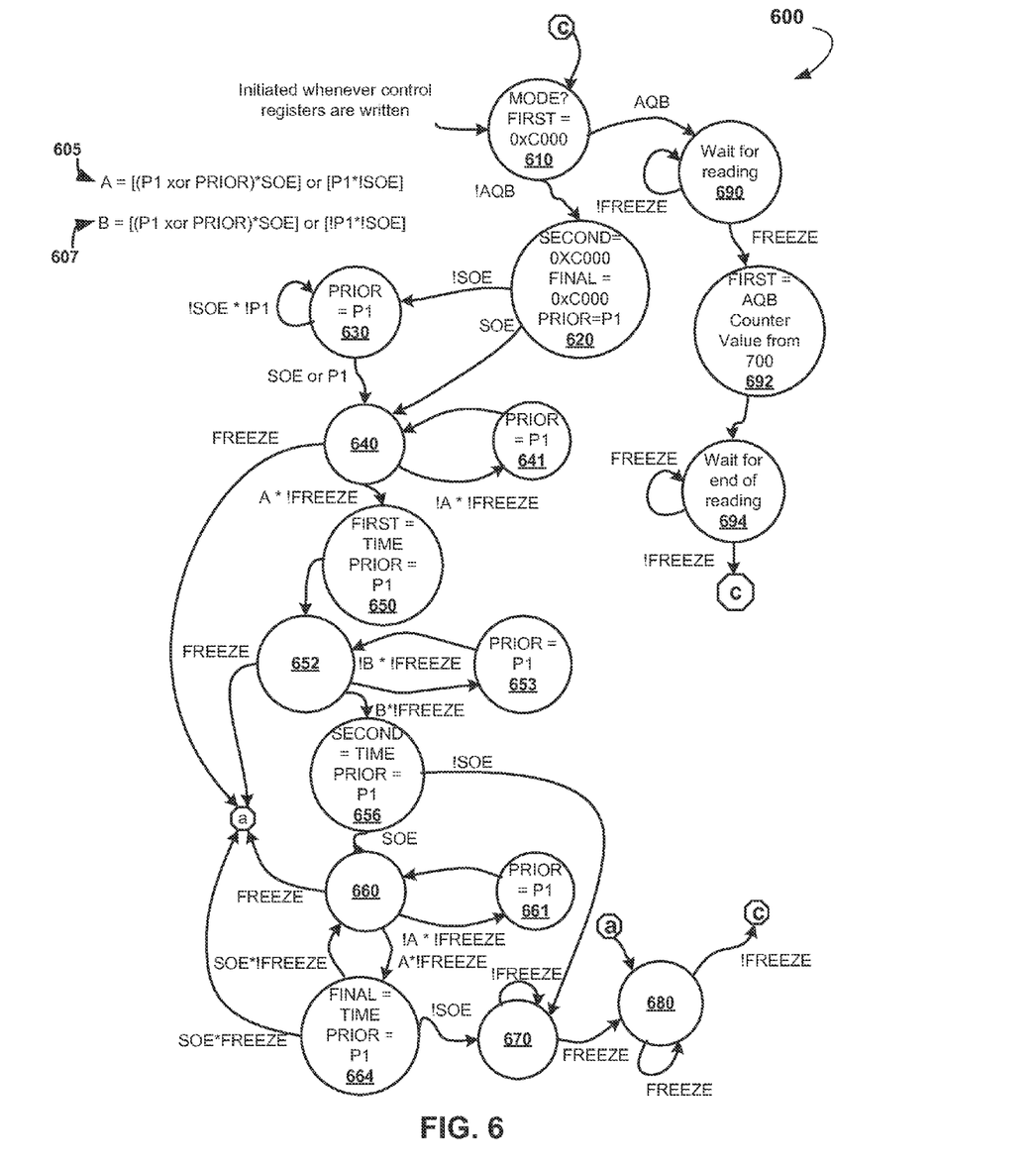
FIG. 6 shows an example flow diagram illustrating a state machine process for measuring signal parameters according to an embodiment of the disclosure.

FIG. 6 shows an example flow diagram illustrating a state machine process 600 for measuring signal parameters, according to an embodiment of the disclosure. Specifically, FIG. 6 shows a process for measuring signal parameters within the ASIC interface 110 or within one or more of its state machines which operate at a logic clock speed fast enough to allow the inputs to be stable for at least two clocks. The state machine process 600 may be controlled via registers 360A, 360B by processing "SOE," "AQB" ("A-quad-B"), and "FREEZE" signals (or bits) as received from the monitoring system 130. Inversions in the signals are shown by a "!" sign. An intermediate logic step 605 creates a signal "A" based on filtered signal "P1 xor PRIOR," when in the SOE mode, or P1, when not in the SOE mode. In other words, A=[(P1 xor PRIOR)*SOE]or[P1*!SOE]. Similarly, an intermediate logic step 607 generates a signal "B" as B=[(P1 xor PRIOR)*SOE] or[!P1*!SOE]. A logic step 610 is initiated whenever the ASIC interface 110 or one or more of its state machines are reset. For example, it might happen, when the control registers are being written or when the operations of the state machine have completed and another pass is about to occur. At this step, it may be determined whether the logic is performing the A-quad-B monitoring mode or some other modes, branching either to a step 690 for AQB mode or a step 620. The monitoring system 130 is fast enough so that it reads can occur within two clocks, keeping "FREEZE" bit to a single pulse to maintain monitoring of the external signals to the ASIC interface 110.

When the state machine process 600 is intended to measure SOE events, the control value SOE is set and the AQB register is cleared within the registers 360A or 360B by the monitoring system 130, and the process 600 proceeds from step 610 to step 620. The step 620 initializes the registers 360A or 360B for values of "SECOND," "FINAL," and "PRIOR" bits. In this example, value 0xC000 indicates an initialized value that does not represent a time stamp or other value to allow the monitoring system 130 to notice whether the ASIC interface 110 or one or more of its state machines determined a change in the signal "P1" occurring.

The "PRIOR" bit is used to track changes in the input signal state, while the "SECOND" and "FINAL" bits are used for time stamp information. In the SOE mode, step the 640 is next entered. If the intermediate value A is not set at step 605, the "PRIOR" bit is set to the value of the "P1" signal in step 641 with a return back to step 640. This sequence of steps 640 and 641 occurs until the "P1" signal changes, in turn setting the intermediate value A at step 605 to initiate transition from step 640 to step 650. At the step 650, the "FIRST" bit is updated with a time stamp indicating when the change has occurred. The process 600 then proceeds to a step 652.

At step 652, monitoring is conducted for a second change in the "P1" signal, waiting for an intermediate signal B to be set at step 607. If the intermediate signal B is not set, then the "PRIOR" bit is updated in a step 653. When the intermediate signal B is set, at a step 656, the time stamp is saved in the "SECOND" bit within the interface registers 360A or 360B. Similarly, at a step 660, a loop with either steps 661 or 664 is performed to save the time stamps in "FINAL" bit whenever A is set, with the difference that step 664 returns back to step 660 unless the "FREEZE" bit is asserted or the SOE mode is turned off. This repetition overwrites the "FINAL" bit as the signal "P1" continues to change, allowing for up to 3 time values despite however many changes may occur in the signal "P1."

When the monitoring system 130 desires to read the SOE information, the "FREEZE" bit is asserted via the registers 360A or 360B. A step 680 is entered from either step 640 (when no change occurred), step 652 (one change occurred), or steps 660 or 664 (two or more changes occurred). The registers 360A or 360B may be read while the "FREEZE" bit is asserted, and once the read is completed by the monitoring system 130 then the "FREEZE" bit is cleared. The process 600 may then continue from step 680 to step 610 in order to restart the process 600.

According to one or more embodiments, the monitoring system 130 can interrupt the process 600 by asserting the "FREEZE" bit via the registers 360A or 360B. This allows for the operations to be halted for a change in mode or for test purposes.

When the state machine process 600 is intended to measure frequency or phase, the "SOE" and "AQB" bits are both cleared within the registers 360A or 360B. The process 600 may first be initialized at steps 610 and 620, continuing then to step 630 to wait for the signal "P1" to go high or low. Step 630 is left if the signal "P1" goes high/low (normal operation) or the "SOE" bit is asserted (to allow the ASIC interface 110 or one or more of its state machines to be tested), passing through steps 640 to 650 resulting in the time stamp being saved in step 650. The falling edge of the signal "P1" may next be captured in the loop between steps 652 and 653 with the time stamp saved in the "SECOND" bit during step 656. Step 656 may then exit to step 660, and then going to a step 670 to wait for the monitoring system 130 to read the registers 360A or 360B. When frequency is measured, the difference in successive "FIRST" bits indicates time which may be inverted to yield frequency. When phase width is measured, the calculation uses bits ("SECOND"–"FIRST") divided by the difference of the "FIRST" bit and the prior "FIRST" bit.

Figure 7:
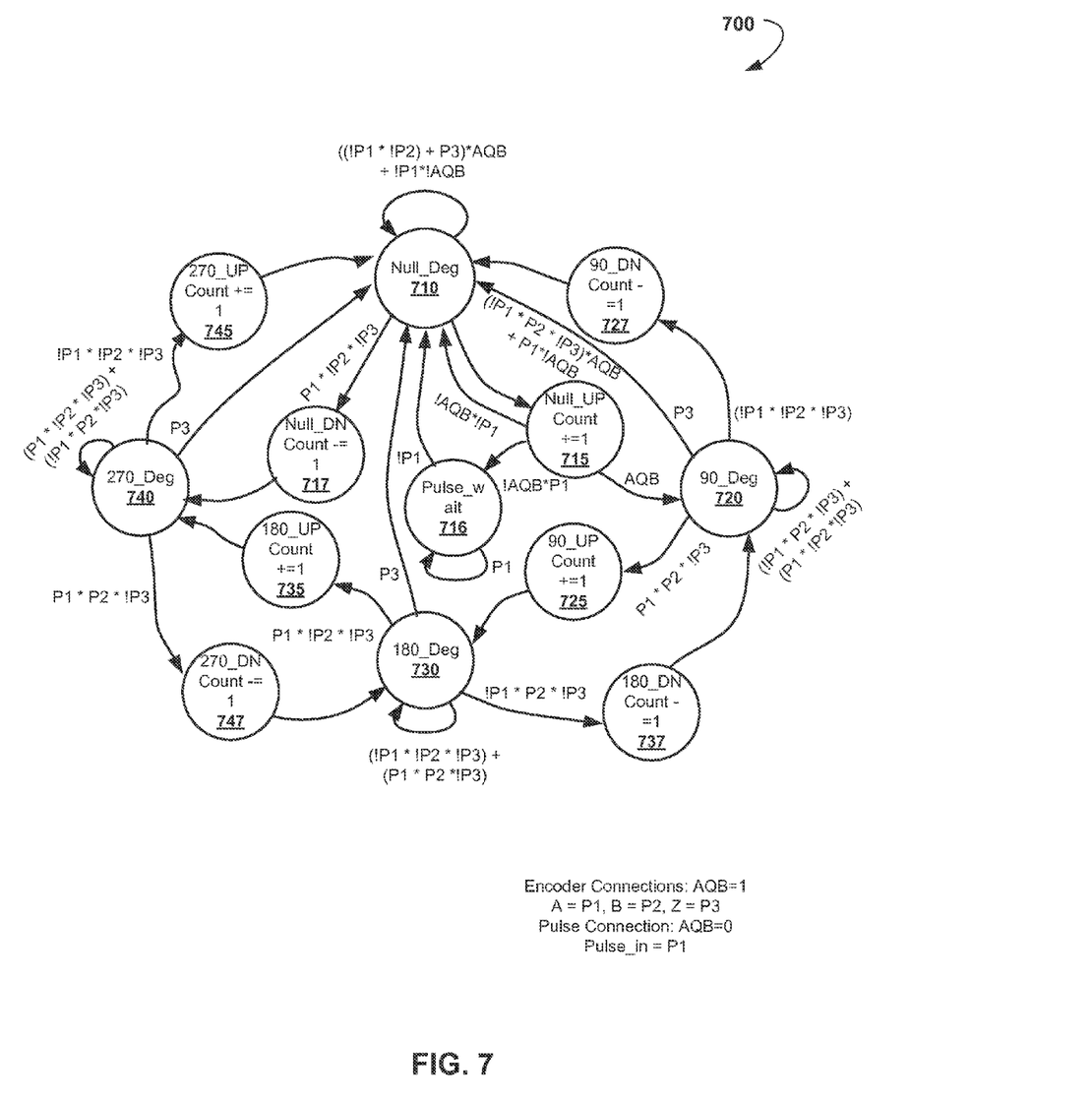
FIG. 7 shows another example flow diagram illustrating a state machine process for measuring signal parameters according to an embodiment of the disclosure.

FIG. 7 shows a flow diagram illustrating another example state machine process 700 for measuring signal parameters according to an embodiment of the disclosure. Specifically, FIG. 7 shows a process for measuring A-quad-B counts. The process 700 may be implemented by the ASIC interface 110 or by one or more of its state machines. The process 700 may use the results of steps 690, 692 and 694 of the process 600 to load parameters to the holding register "FIRST" bit (i.e., part of the register 360A or 360B). The monitoring system 130 controls the "FREEZE" bit via the registers 360A or 360B allowing the process 700 to run while the "FREEZE" bit is cleared (step 690), then passes through step 692 loading the value into the "FIRST" bit from the AQB bit within the process 700. At the next step 694, the "FREEZE" bit is waiting to be cleared by the monitoring system 130 via the register 360A or 360B. Once the "FREEZE" bit is cleared, the mode selection at step 610 is again entered and this loop may occur again.

FIG. 7 shows the process for measuring A-quad-B counts monitored by the ASIC interface 110 or by one or more of its state machines. There are three inputs used—signals "P1", "P2" and "P3," matching the typical shaft encoder connections for phase_A, phase_B and zero as described above. When the A-quad-B mode is set, whenever the input signal "P3" is set to indicate that the encoder is passing through its reference location, step 710 is initiated. The process 700 can be used for pulse counting (i.e., when the "AQB" bit is cleared) or for quadrature counting (i.e., when the "AQB" bit is set). The clocking for the process 700 is enabled by the same "FREEZE" bit used in the process 600 allowing the state steps to be frozen during reads of the counter within the process 700.

When the process 700 is used for counting, i.e. when the signal "P1" is set, then a step 715 is entered from step 710; otherwise the process 700 remains at step 710. A step 715 is then performed to clear a bit associated with waiting for the signal "P1" (at a step 716). Once cleared, the process 700 goes back from step 716 to step 710. While passing through step 715, the counter is incremented.

When the process 700 is used in quadrature mode, step 710 is assumed to be where the signals "P1" and "P2" are both cleared. This assumption is forced by zero input on the signal "P3," with the system typically forcing a full revolution on an input device (e.g., a shaft encoder) to force the signals "P1" and "P2" to match the signal "P3." The process then goes from step 710 to steps 715 or 717, depending on whether the signal "P1" or "P2" is set first. If the process 700 proceeds to step 715, the count is incremented and then a step 720 is entered. If the process 700 proceeds to step 717, the count is decremented and a step 740 is entered. Similar behavior occurs in step 720 for the signals "P1," "P2"=01 changing to either 00 or 11, a step 730 for the signals "P1," "P2"=11 changing to either 10 or 01, and step 740 for the signals "P1," "P2"=10 changing to either 00 or 11. Illegal changes are handled by staying in the appropriate state, allowing the bits to settle. As an example, if in step 720 the signals "P1," "P2" are waiting to be changed from 01, and if it is determined that the inputs go directly to 10 (i.e., both bits are changed), then the process remains in step 720 until the bits are settled to either 00 or 11. Otherwise, if the bits remain at 01, then the count is kept unchanged.

Those skilled in the art would recognize that other embodiments may have additional state steps. Furthermore those skilled in the art would recognize that a computing device, logic, controller, or processor can perform any, some, or all of the operations of the method 500 and the processes 600, 700 shown in FIGS. 5-7. The method and processes of FIGS. 5-7 are illustrated as logical flow diagrams, in which each operation represents a sequence of operations that can be implemented in hardware, software, or a combination thereof. In the context of software, the operations can represent computer-executable instructions stored on one or more non-transitory computer-readable storage media that, when executed by one or more processors, perform the recited operations. Generally, computer-executable instructions can include routines, programs, objects, components, data structures, and the like that perform particular functions or implement particular abstract data types. The order in which the operations are described is not intended to be construed as a limitation, and any number of the described operations can be combined in any order and/or in parallel to implement the processes.

Thus, various methods and systems for monitoring electrical signals have been described. Although the embodiments have been described with reference to specific examples, it will be evident that various modifications and changes can be made to these example embodiments without departing from the broader spirit and scope of the present application. Accordingly, the specification and drawings are to be regarded in an illustrative rather than a restrictive sense.

What is claimed is:

1. A method comprising:
   receiving, by at least one controller, at least three signals, wherein the at least three signals comprise at least one value associated with at least one monitored parameter;
   determining, by the at least one controller, that the at least one value of the at least three signals is outside of a predetermined range of values;
   detecting, by the at least one controller, a deviation of the at least one value associated with the at least three signals from an expected value within the predetermined range of values;
   determining, by the at least one controller, that the deviation exceeds a predetermined period of time threshold; and
   determining, by the at least one controller, a change in the at least one of the at least three signals based at least in part on the determination that the deviation exceeds the predetermined period of time threshold.

2. The method of claim 1, wherein the controller receives the at least three signals via a first channel and a second channel.

3. The method of claim 2, wherein the at least three signals are generated by at least one repetitive signal source or counter.

4. The method of claim 3, wherein the at least one repetitive signal source or counter comprises one or more of an incremental encoder, a rotary encoder, and a rollover counter.

5. The method of claim 1, wherein the at least three signals comprise one or more of a frequency-modulated signal, a amplitude-modulated signal, and a pulse-width modulated signal.

6. The method of claim 1, wherein the at least three signals comprise one or more of A-quad-B signals.

7. The method of claim 1, wherein the monitored value comprises a measurement associated with at least one of: signal amplitude, signal frequency, a signal pulse width, or a signal phase.

8. The method of claim 1, wherein at least one of the at least three signals is associated with a timing signal.

9. The method of claim 8, wherein the deviation of the at least one value is detected based at least in part on the timing signal.

10. The method of claim 1, further comprising generating one or more time stamps associated with the at least three signals.

11. The method of claim 10, wherein the one or more time stamps are generated by a counter.

12. The method of claim 1, further comprising generating a log entry associated with the change in at least one of the at least three signals.

13. The method of claim 12, wherein the log entry comprises a time stamp associated with the change in at least one of the at least three signals.

14. The method of claim 12, further comprising generating a log file comprising two or more log entries.

15. The method of claim 14, wherein the log file comprises three log entries respectively associated with the first, the second and the most recent change in the at least one of the at least three signals.

16. The method of claim 12, further comprising transmitting the log entry to a monitoring system.

17. The method of claim 1, further comprising applying low pass filtering to the at least three signals.

18. The method of claim 1, further comprising performing a measurement of a frequency of one or more of the at least three signals.

19. A system comprising:
   an input unit configured to receive at least three signals, wherein the at least three signals comprise at least one value associated with at least one monitored parameter; and
   at least one controller, wherein the at least one controller is configured to:
      determine that the at least one value for the at least three signals is outside of a predetermined range of values;
      detect a deviation of the at least one value associated with the at least three signals in an expected value within the predetermined range of values;

determine that the deviation exceeds a predetermined period of time threshold; and determine a change in at least one of the at least three signals based at least in part on determining that the deviation exceeds the period of time threshold.

20. The system of claim 19, wherein the at least one controller is further configured to generate a log entry associated with the change in at least one of the at least three signals, wherein the log entry includes a time stamp associated with the change in at least one of the at least three signals.

* * * * *